(12) United States Patent
Malhotra (10) Patent No.: US 8,923,380 B1
(45) Date of Patent: Dec. 30, 2014

(54) DATA PATTERN BIAS DETECTION

(71) Applicant: Xilinx, Inc., San Jose, CA (US)

(72) Inventor: Gaurav Malhotra, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/053,344

(22) Filed: Oct. 14, 2013

(51) Int. Cl.
 *H03H 7/30* (2006.01)
 *H04B 1/709* (2011.01)
 *H04B 1/16* (2006.01)

(52) U.S. Cl.
 CPC . *H04B 1/709* (2013.01); *H04B 1/16* (2013.01)
 USPC .......................................................... 375/232

(58) Field of Classification Search
 CPC ................... H04L 25/03038; H04L 25/03057; H04L 2025/03617; H04L 2025/03477; H03H 21/0012; H04B 1/709; H04B 1/16

USPC .......................................................... 375/232
See application file for complete search history.

(56) References Cited

U.S. PATENT DOCUMENTS

2010/0246722 A1* 9/2010 Campeau ...................... 375/319
2012/0242899 A1* 9/2012 Lin ............................... 348/534

* cited by examiner

*Primary Examiner* — Juan A Torres
(74) *Attorney, Agent, or Firm* — W. Eric Webostad (57) ABSTRACT

An apparatus relating generally to data pattern bias detection is disclosed. This apparatus includes a bias detector. A slicer is coupled to the bias detector to provide an error signal from the slicer to the bias detector. The bias detector is configured to determine a difference between an error input and an error mean for the error signal to detect a presence of correlated data in input signaling.

20 Claims, 6 Drawing Sheets

DATA PATTERN BIAS DETECTION

TECHNICAL FIELD

The following description relates to integrated circuit devices ("ICs"). More particularly, the following description relates to data pattern bias detection for an IC.

BACKGROUND

Transmitted information may include a clock pattern, a synchronization pattern, or other non-random pattern with respect to channel adaptation. Such transmitted information may likewise include data, which is generally a random pattern with respect to channel adaptation. A receiver, which may be a standalone receiver or a receiver of a transceiver, receives such information and may include one or more adaptation loops for channel adaptation. Generally, channel adaptation includes adjusting a receiver to a channel. More particularly, channel adaptation may include adjusting filter tap coefficients for a channel impulse response. Such channel adaptation loops produce incorrect results when information is non-random.

Heretofore, for correlation, a receiver would include a plurality of correlators, such as a bank of correlators, where each correlator was configured for a different non-random or fixed pattern. For example, if there were 10 known fixed patterns in serialization-deserialization of information, then there would be 10 corresponding correlators configured to detect a respective one of such fixed patterns. Examples of such fixed patterns may include K28.5, DCom, EyeH, and RPAT, among other patterns. Once one of such correlators detected a known fixed pattern, one or more channel adaptation loops would be controllably frozen so as not to diverge responsive to trying to adapt to such fixed pattern. This freezing of one or more channel adaption loops may be set to a fixed time (e.g., frozen for a minute or some other time before releasing a channel adaptation loop), and such time may be programmably be set by a user. However, having a bank of correlators consumes a significant amount of resources, such as power and/or semiconductor area. Furthermore, freezing adaptation loops for a fixed time may exceed the amount of time a fixed pattern is being received, and thus an adaptation loop may be frozen for a longer time than necessary. Separately or additionally, a transmitter may send a fixed data pattern for a longer time than conventionally specified, such as by a standard communication protocol or other communication specification.

Hence, it would be desirable and useful to provide channel adaptation that overcomes one or more of the above-described limitations.

SUMMARY

An apparatus relates generally to data pattern bias detection. Such an apparatus includes a bias detector. A slicer is coupled to the bias detector to provide an error signal from the slicer to the bias detector. The bias detector is configured to determine a difference between an error input and an error mean for the error signal to detect a presence of correlated data in input signaling.

Another apparatus relates generally to data pattern bias detection. In such an apparatus, a running average block is coupled to receive an error output from a slicer to provide an average therefor. A comparator is coupled to the running average block to receive the average from the running average block to compare the average with a threshold value. The comparator is coupled to assert a flag signal responsive to the average being greater than the threshold value. At least one adaptive loop block is coupled to receive the flag signal. The at least one adaptive loop block is coupled to temporarily suspend operation thereof responsive to assertion of the flag signal.

A method relates generally to data pattern bias detection. In such a method, information is received by a slicer. A running average is determined for an error output from the slicer. The running average is compared with a threshold value. A flag signal is asserted in response to the running average being greater than the threshold value. Operation of at least one adaptive loop block is temporarily suspended in response to assertion of the flag signal.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Generally, channel adaptation loops produced either only a positive or only a negative feedback responsive to a fixed data pattern, such as a clock pattern for example, rather than dithering around a target value, once such target value has been reached, in contrast to random data. This data pattern bias may be detected, as described below in additional detail, so as to avoid the use of a bank of correlators.

Along those lines, a bias detector may be coupled to a slicer to receive an error signal from such slicer. Such bias detector may be configured to determine a difference between an error input and an error mean for such error signal to detect presence of correlated data in input signaling. Furthermore, bias detector is likewise configured to detect absence of correlated data in input signaling, as a reverse of the relationship of detection of the presence of correlated data in input signaling.

With the above general understanding borne in mind, various configurations for detection of data pattern bias are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
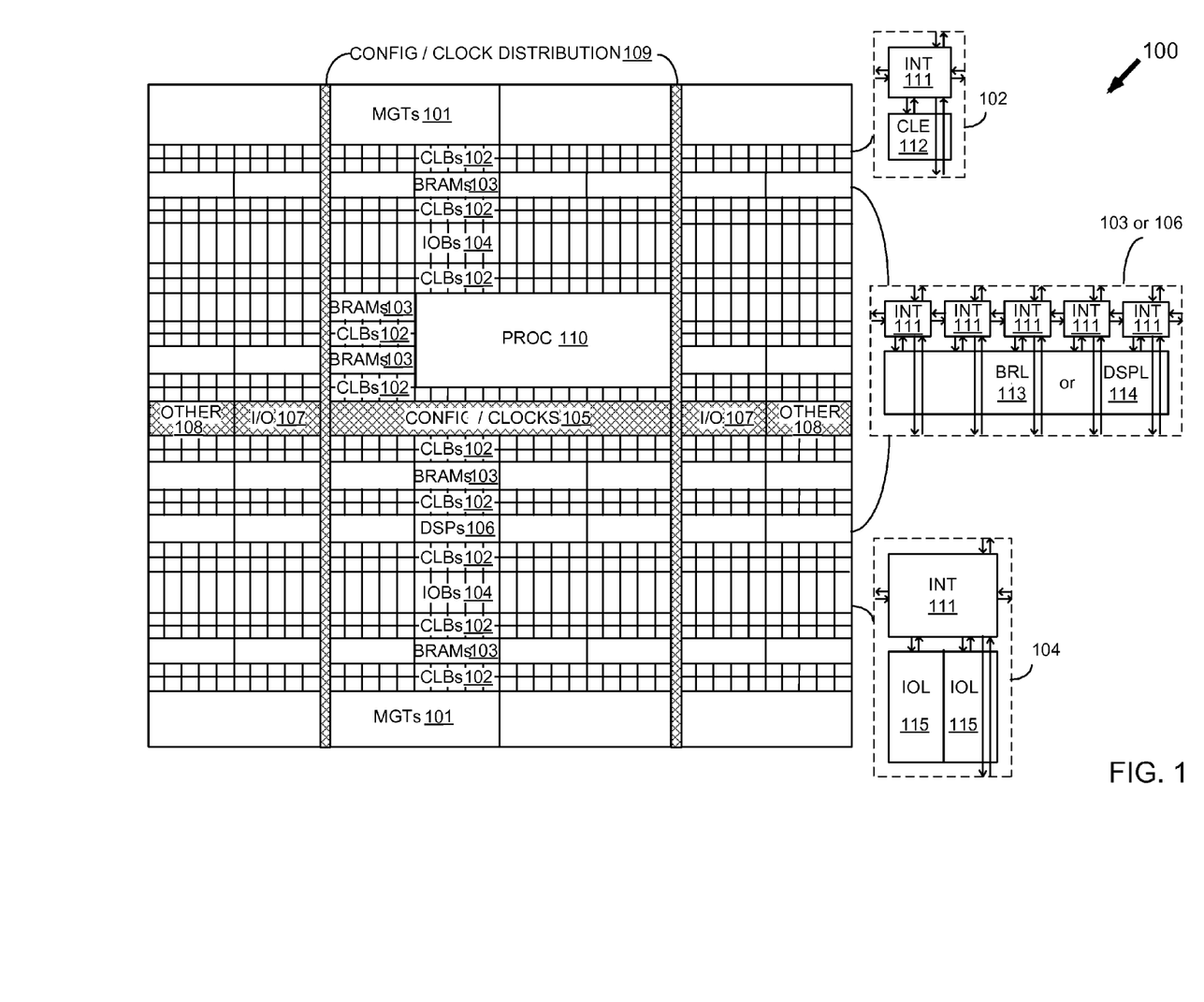
FIG. 1 is a simplified block diagram depicting an exemplary columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
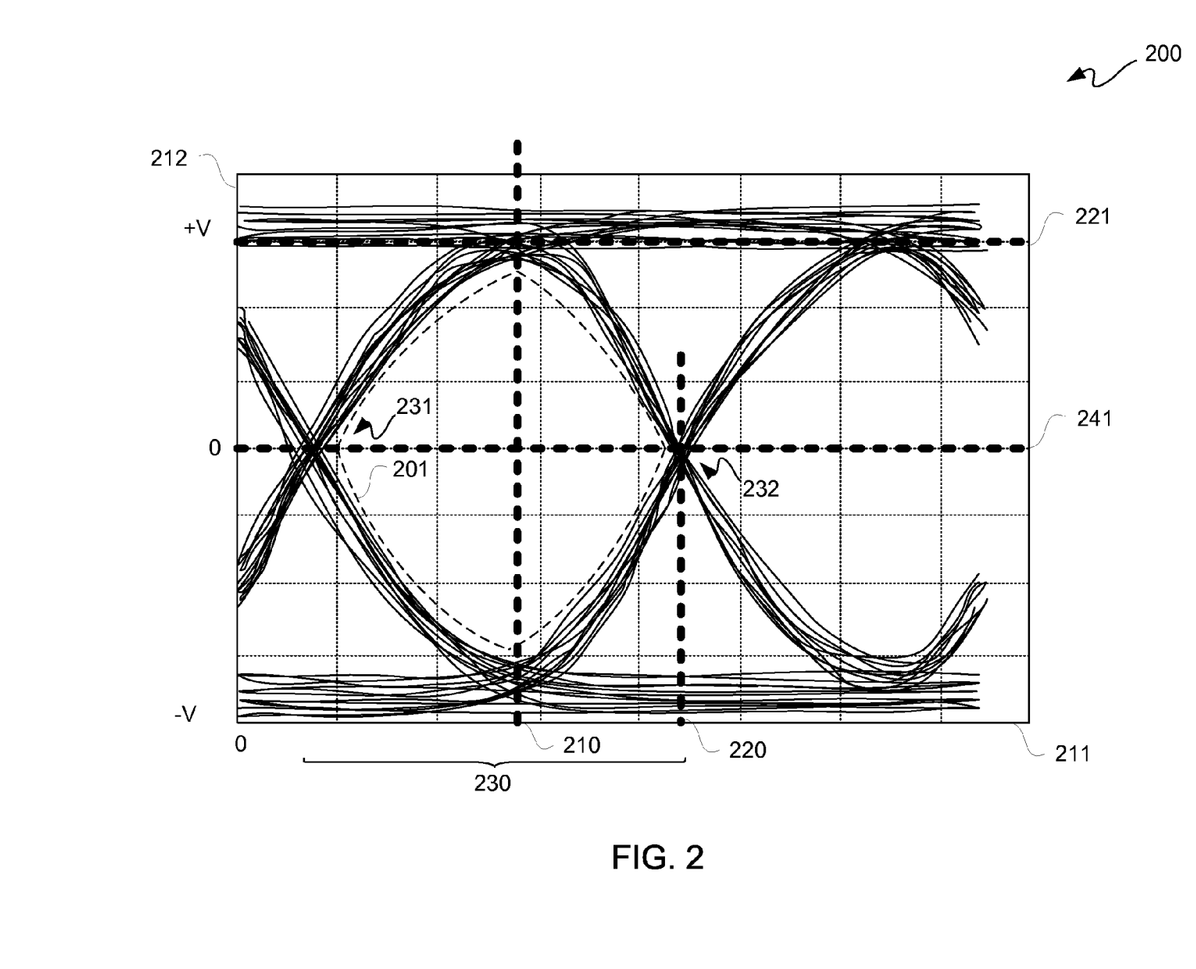
FIG. 2 is a signal diagram depicting exemplary received signaling forming data eyes for uncorrelated data.
Figure 3:
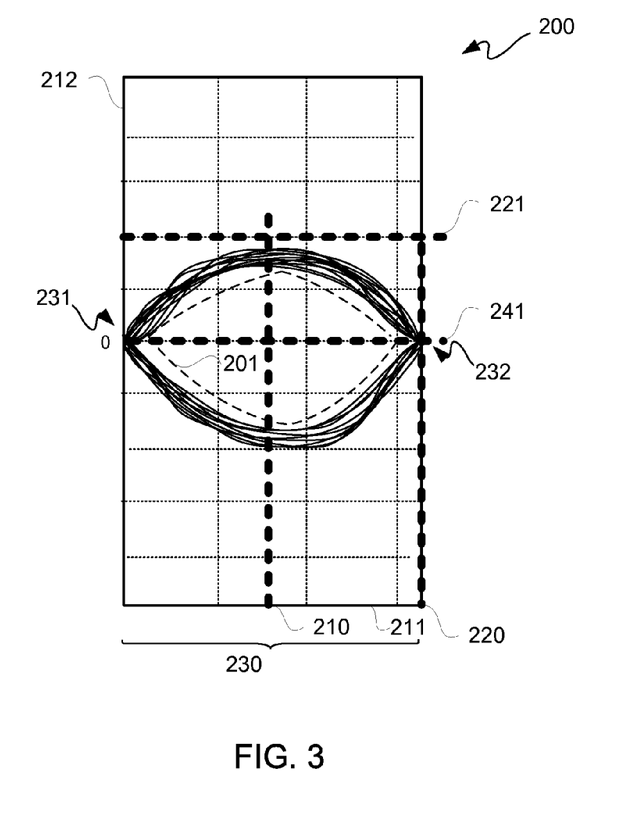
FIG. 3 is a signal diagram depicting exemplary received signaling forming data eyes for correlated data.

FIG. 2 is a signal diagram depicting exemplary received signaling 200 forming data eyes, such as for example generally data eye 201, for uncorrelated data. Signaling 200 in FIG. 2 is for received transmitted "random" data, namely generally there is no correlation between individual data samples. FIG. 3 is a signal diagram depicting exemplary received signaling 200 forming data eyes, such as for example generally data eye 201, for correlated data. Signaling 200 in FIG. 3 is for received transmitted "non-random" data, such as a fixed data pattern for example. A common example of a fixed data pattern is a clock pattern formed by sending a logic 1 followed by a logic 0 and repeating. Of course, this is just one example of a fixed data pattern, as there are many possible fixed data patterns. With simultaneous reference to FIGS. 2 and 3, signaling 200 is further described.

Data eye 201 may be described using a phase, as generally indicated by sampling phase horizontal axis 211, and amplitude, as generally indicated by voltage vertical axis 212. For example, sampling phase may be in units of a phase interpolator ("PI") code, and amplitude may be in units of volts.

For purposes of clarity by way of example and not limitation, it shall be assumed that a non-return-to-zero ("NRZ") form of signaling is used, and thus zero crossings, such as generally zero crossings 231 and 232 for example, may be used for sampling. However, in another implementation, NRZ inverted ("NRZI") or a non-zero crossing form of signaling may be used. Furthermore, even though the following description is generally in relation to a binary pulse amplitude modulation ("PAM"), such as an NRZ/PAM-2, mode of communication, the following description is application to PAM-4 or other types of modulation.

A zero crossing is where a signal crosses a 0 voltage level, such as a zero voltage level or threshold 241, along voltage vertical axis 212, which may be detected as a change from a positive to a negative voltage, or vice versa. Distance 230 between adjacent data crossings may be defined to be a unit interval ("UI"). A UI may be defined in terms of a PI code. For example, if a PI has 64 taps, a UI may be 64 units or increments of a PI code. This is just one example, and another number of taps or increments of a PI may be used. Accordingly, distance 230 may be defined as 360 degrees or $\pi$ radians. Another term used to described a time instance of a signal, such as in lieu of PI code, may be sampling phase or sampling phase point or position.

For random data, each received signal of signaling 200 does not necessarily cross at the same exact zero crossing location with respect to a PI code location, and likewise each received signal of signaling 200 does not necessarily peak at the same exact peak voltage location with respect to a PI code location. Along those lines, a first slicer, which may be referred to as an error slicer, may be set to sample at a PI code location 210. PI code location 210 may be an anticipated location of voltage peaks of sampled signals of signaling 200. Likewise, a second slicer, which may be referred to as a crossing slicer, may be set to sample at another PI code location 220. In this example, an error slicer and a crossing slicer are configured to sample 180 degrees apart from one another, namely half of a symbol width or UI, namely half of width or distance 230, from each other. PI code location 220 may be an anticipated location of zero crossings of sampled signals of signaling 200. A slicer or a data slicer may be set to sample a data eye ("eye") at a tap of a chain of taps of a PI representing a point in time and may convert such sample to a logic 0 or 1 depending on the sign of such sampled data.

An error slicer may be set to determine whether a voltage is above (including equal to) or below a voltage peak threshold, such as generally indicated as voltage peak threshold 221, at PI code location 210. While output of such an error slicer may be a logic 1 or a logic 0, such sampling is for determining an error state of data and not a data state of data. Thus, output of an error slicer may be thought of as an error on a plus side +e or error on a minus side −e, depending on whether a sampled signal is above or below, respectively, a voltage peak threshold when sampled at PI code location 210. Mean output of an error slicer for "random" data generally has a mean of zero for a sufficient number of samples, meaning that half of such samples will be above voltage peak threshold 221 when sampled at PI code location 210 and the other half of such samples will be below such voltage peak threshold when sampled at PI code location 210.

In contrast, for a fixed data pattern, which by itself may have a mean of zero with respect to k numbers of logic 1s and 0s within such pattern, an error slicer mean output diverges from zero. More generally, "non-random" data may cause an error slicer mean output to significantly diverge from zero. In other words, for a fixed data pattern, sampled data may be at the same voltage position for each sample taken at PI code location 210 by an error slicer. Thus, for example, each sample taken by an error slicer at PI code location 210 may be below voltage peak threshold 221, as for example in FIG. 3, for a fixed data pattern, and so output of such an error slicer may be −e, −e, −e . . . . In the example of FIG. 3, incoming data is colored, namely a fixed clock pattern of repeating 1010 . . . . An eye 201 of such a pattern indicates that each data sample for this example pattern may lie below a mean. In other words, all the error values, namely error slicer input minus error slicer mean, will be negative. An error slicer may be configured to adjust its mean, namely again its average value defined as error slicer input minus error slicer mean output, such that error is zero on an average. If a receiver is allowed to determine a new error mean, such receiver may eventually get into a zero mean position but this may take a long time, and so it would be better to react sooner than in the past. Likewise, for example, each sample taken by an error slicer at PI code location 210 may be above voltage peak threshold 221, and so output of such an error slicer may be +e, +e, +e . . . . In either of these examples, error slicer mean output diverges from zero.

A crossing slicer may be set to determine whether a voltage is above (including equal to) or below a zero volts threshold at PI code location 220. While output of such a crossing slicer may be a logic 1 or a logic 0, such sampling is for determining a crossing state of data and not a data state of data. Thus, output of a crossing slicer may be a late error +t or an early error −t, depending on whether a sampled signal is after or before, respectively, a PI code location 220 for sampling of a zero voltage level or threshold 241 crossing. Mean output of a crossing slicer for "random" data generally has a mean of zero for a sufficient number of samples, meaning that half of such zero crossing samples will be before PI code location 220 and the other half of such zero crossing samples will be after PI code location 220.

In contrast, for a fixed data pattern, which by itself may have a mean of zero with respect to k numbers of logic 1s and 0s within such pattern, a crossing slicer mean output diverges from zero. More generally, "non-random" data may cause a crossing slicer mean output to significantly diverge from zero. In other words, for a fixed data pattern, sampled data may be at the same PI code position for each sample taken with respect to PI code location 220 by a crossing slicer. Thus, for example, each sample taken by a crossing slicer at PI code location 220 may be before such location, such as for example in FIG. 3, for a fixed data pattern, and so output of such an error slicer may be −t, −t, −t . . . . Conversely, for example, each sample taken by a crossing slicer at PI code location 220 may be after such location for a fixed data pattern, and so output of such a crossing slicer may be +t, +t, +t, +t, . . . . In either of these examples, crossing slicer mean output diverges from zero.

To recapitulate, a root cause of degradation may be a bias that is created when a data pattern is received having correlation between successive samples for k symbols or bits. In signal processing, such non-random data is referred to as "colored data" meaning that there is correlation between data symbols or bits. Because of such bias, an update applied to filter coefficients in a receiver may be in only one direction rather than being random, and such unidirectional coefficient adjustment generates tap drift, which may lead to a loss of a communication link, namely link failure.

As described below herein in additional detail, by monitoring mean of a slicer output, such as either or both an error slicer and a crossing slicer, it may be determined when a colored data pattern appears instead of random data. Because of this change from random data to non-random data, or from non-colored data to colored data, receiver degradation may be directly identified without reference to a particular correlator in a bank of correlators. In other words, once onset of a colored data pattern is detected by measuring a sufficient divergence from a mean of zero, corrective action, such as freezing one or more adaptive loops, may be invoked before such adaptive loops substantially diverge and/or degrade receiver performance. Along those lines, divergence from a mean of a slicer output from a value of zero, plus or minus some divergence threshold amount therefrom, may be used to indicate whether adaptive loops are to be halted ("frozen"), as well as when such adaptive loops are to be released ("unfrozen") for when such mean is within such bounded range of divergence from a value of zero. Heretofore in a serializer-deserializer ("SERDES") environment, there may be about 20 to 30 blocks of hardware for correlation, namely a correlator for each data pattern to be guarded against. However, as each of these data patterns cause a same symptom of generating an error bias, such correlation blocks may be replaced with circuitry to identify such symptom, which is a significant reduction in hardware. In the past, generally 20 to 30 hardware correlation blocks may have been used, which effectively may be reduced to the equivalent of one of such hardware blocks. Additionally, because onset of a colored data pattern may be more directly measured by monitoring a running average of a slicer output, corrective action may be initiated before one or more communication channel adaptive loops have a chance to significantly diverge and degrade receiver performance. In other words, a bias detector as described herein may respond sooner to receipt of a colored data pattern than a conventional correlator, which may mean less degradation of receiver performance than in the past. Moreover, a bias detector as described herein may respond sooner to cessation of receipt of a colored data pattern than a conventional correlator, which may mean less time waiting for reinstating performance of one or more communication channel adaption loops than in the past.

Figure 4:
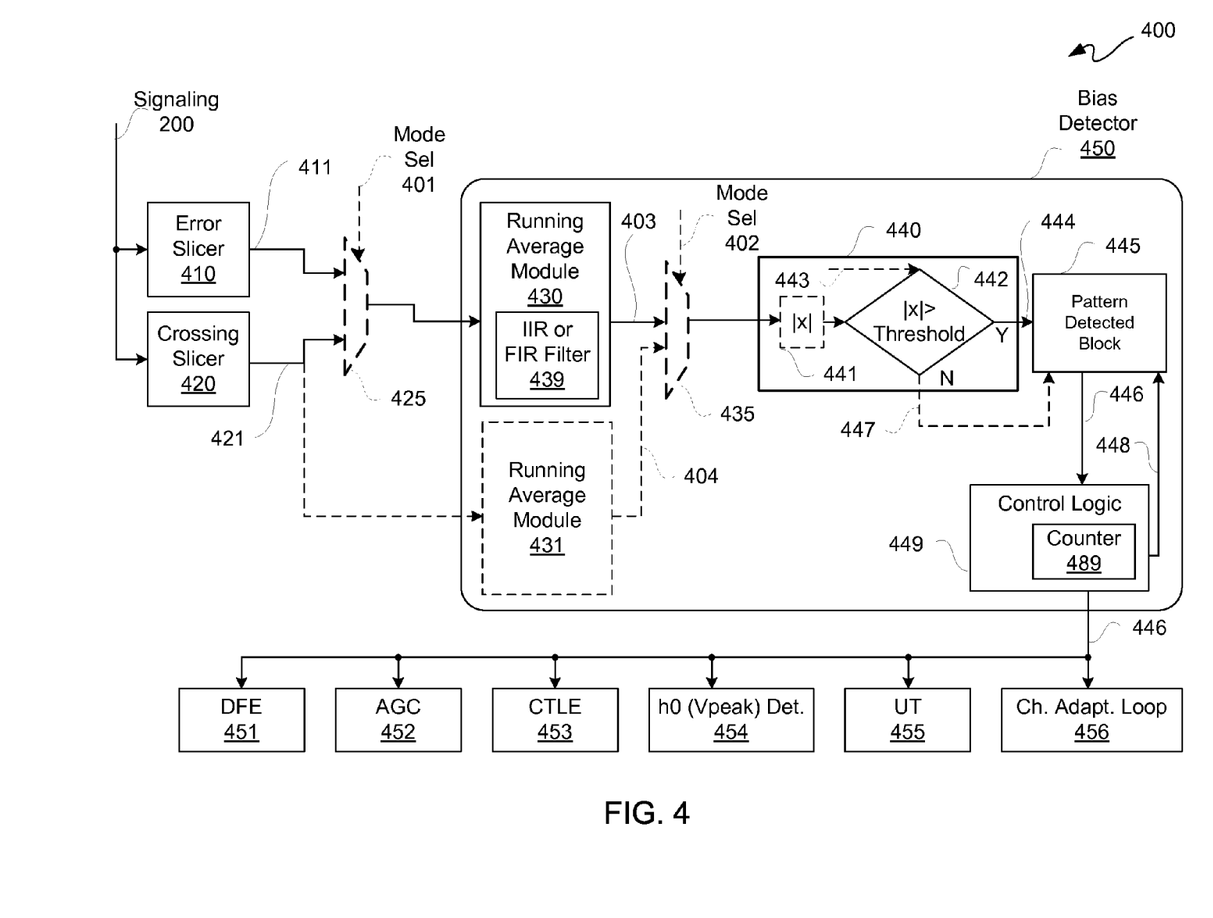
FIG. 4 is a block/flow diagram depicting an exemplary data pattern bias detection system.
Figure 5:
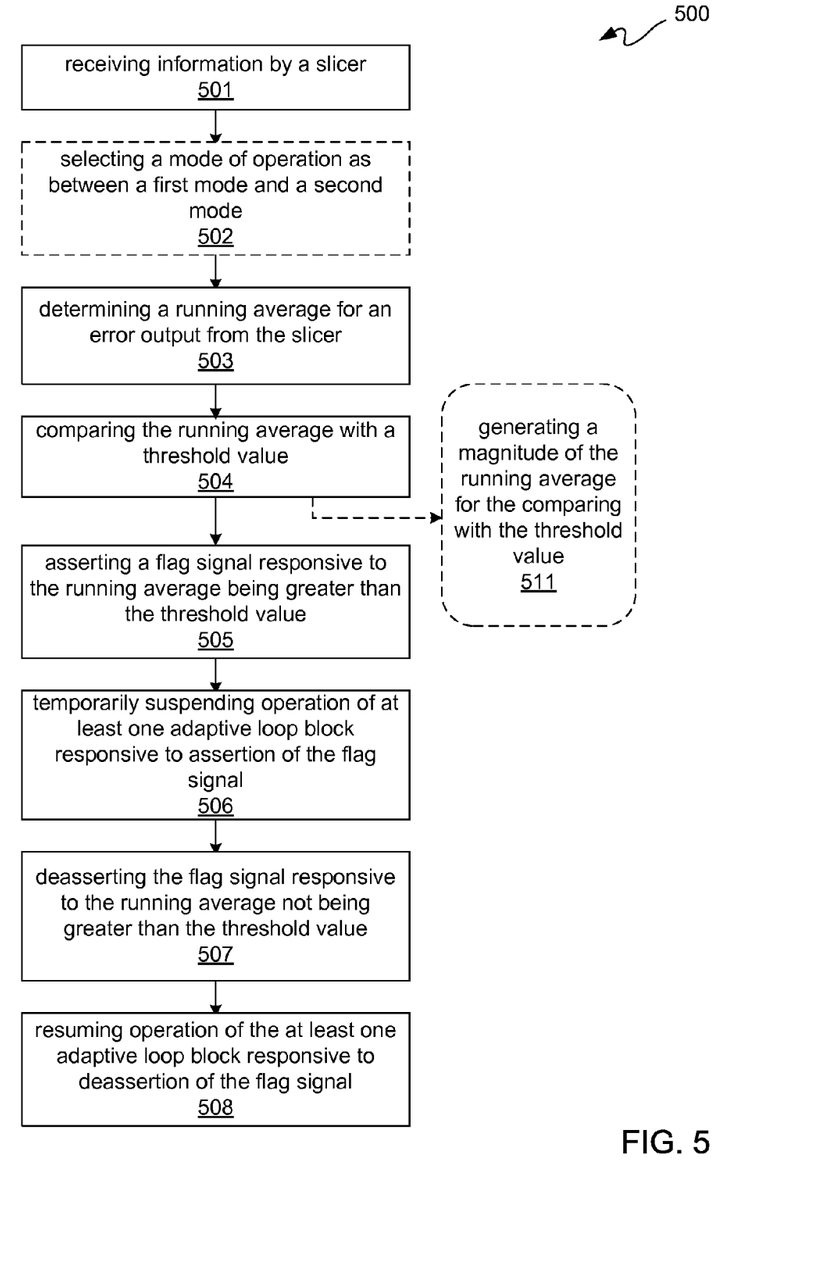
FIG. 5 is a flow diagram depicting an exemplary data pattern bias detection flow.

With the above description borne in mind, a bias detection system and a sequence of operations therefor is described with reference to FIGS. 4 and 5. FIG. 4 is a block/flow diagram depicting an exemplary data pattern bias detection system 400. FIG. 5 is a flow diagram depicting an exemplary data pattern bias detection flow 500, which may be a sequence of operations carried out using bias detection system 400 of FIG. 4. With simultaneous reference to FIGS. 4 and 5, bias detection system 400 and bias detection flow 500 are simultaneously described.

Bias detection system 400 includes at least one slicer and a bias detector 450. In this example, both an error slicer 410 and a crossing slicer 420 are illustratively depicted for an FPGA implementation. However, only one slicer may be present in other implementations, and such one slicer may be either error slicer 410 or crossing slicer 420. Even though the following description is in terms of an FPGA implementation, the description hereof is not limited to an FPGA implementation, as any IC may be used. Furthermore, even though bias detector 450 is generally described in terms of hardware, bias detector 450 may be implemented using a combination of hardware and software.

At 501, information is received by at least one slicer. Such information may be provided via signaling 200 to at least one of error slicer 410 and crossing slicer 420. Again, even though only one slicer may be present, it shall be assumed for purposes of clarity by way of example and not limitation that both error slicer 410 and crossing slicer 420 are present.

A slicer's output mean in a steady state may be referred to as "h0" and/or "Vpeak". A slicer error may be defined as a slicer input minus a slicer output mean, or generally a difference of input and mean output. When incoming data, such as via signaling 200, is random, namely has no correlation amongst itself, the mean of slicer error is conventionally zero. This is so because most conventional receivers are configured to minimize a mean squared error ("MMSE"). To minimize MMSE, conventionally a slicer is configured to position itself to sample at a position such that on an average the above quantity referred to as slicer error is zero.

A first slicer, namely error slicer 410, receives signaling 200, and in this example error slicer 410 samples the data in signaling 200 at the center of an eye 201. In other implementations, data may not be sampled at the center of an eye. Error slicer 410 is configured to compare such sampled data to a threshold, such as previously described herein, to generate an error signal 411, which may be used for one or more adaptation loops.

A second slicer, namely crossing slicer 420, receives signaling 200, and in this example crossing slicer 420 samples data in signaling 200 at a zero crossing edge of an eye 201 to generate an error signal 421, where such error signal 421 includes timing information for clock data recovery. Again, in this example, slicers 410 and 420 are configured to sample 180 degrees apart from each other; however, in other implementations other phase relationships may be used.

Error signal 411 output from error slicer 410 may be input to an optional multiplexer 425. Likewise, error signal 421 output from crossing slicer 420 may be input to optional multiplexer 425. Optionally, at 502, a mode of operation may be selected as between a first mode and a second mode responsive to assertion of either mode using a mode select signal 401. A mode select signal 401 may be provided to optional multiplexer 425 for selection of either of error signals 411 and 421 for output to a running average module 430 of bias detector 450. For example, if mode select signal 401 is asserted for a decision feedback equalization ("DFE") mode, then error signal 411 may be output from optional multiplexer 425. If, however, for example, mode select signal 401 is asserted for a low power mode ("LPM"), then error signal 421 may be output from optional multiplexer 425.

Either or both error slicer 410 or crossing slicer 420 may have their respective outputs averaged, such as by a running average module 430. Accordingly, error signal 411 may be directly provided to a first running average module 430, and error signal 421 may be directly provided to a second optional running average module 431, where optional multiplexer 425 may be omitted. If both first and second running average modules 430 and 431 are used, running averages of running average signals 403 and 404 respectively output therefrom may be provided to an optional multiplexer 435. Optionally, at 502, a mode of operation may be selected as between a first mode and a second mode responsive to assertion of either mode using a mode select signal 402. A mode select signal 402 may be provided to optional multiplexer 435 to select either an error mode or a crossing mode for respectively selecting either of running average signals 403 and 404 for output from such optional multiplexer 435. Both optional multiplexer 435 and running average module 431 may be of a bias detector 450.

However, for purposes of clarity by way of example and not limitation, it shall be assumed that only a single slicer, error slicer 410 or crossing slicer 420 is used. Accordingly, optional multiplexers 425 and 435, as well as optional running average module 431, need not be present.

A running average block or module 430 may be coupled to receive an error output from a slicer, such as either of error signals 411 or 421 respectively from slicers 410 and 420. Running average module 430 may include an infinite impulse response ("IIR") filter or a finite impulse response filter ("FIR") 439 for determination of such running average. Optionally, running average module 430 may include an accumulator configured to provide a running average. For purposes of clarity and not limitation, it shall be assumed that an IIR filter 439 is used, though other circuit implementations may be used for determining a running average.

At 503, running average module 430 may determine a running average for an error output from a slicer. Running average module 430 may provide such running average via running average signal 403 as an output. Running average module 430 may be configured to output a mean for a slicer error output signal, where such mean output is an average, or more particularly a running average, of such slicer error signal output as previously described.

Running average signal 403 may be input to a comparator module 440 of bias detector 450. Comparator module 440 may include an optional magnitude block 441 and a comparator 442. Running average signal 403 may be compared to determine whether a running average thereof is within a threshold boundary between a positive and a negative running average threshold. In the presence of random data on signaling 200, such running average may hover or dither about zero. However, in the presence of a fixed data pattern or non-random data, namely what is generally referred to as colored data, such running average diverges away from zero in either a positive or negative direction, such as previously described. Accordingly, to save a bit, a magnitude block 441 may optionally be used to receive running average signal 403 to determine a magnitude for a running average, x. If asymmetric positive and negative threshold values are used, multiple comparators 442 along with logic therefor may be used for such comparison to separate out positive and negative threshold values, and magnitude block 441 may be present or may be omitted depending upon implementation.

For purposes of clarity by way of example and not limitation, it shall be assumed that optional magnitude block 441 is used. Along those lines, a running average x on running average signal 403 may be input to magnitude block 441 of comparator module 440, and a magnitude of running average x may be input to a comparator 442. A flow diagram decision diamond is used to illustratively depict a comparator 442 rather than a triangular circuit symbol for purposes of clarity and not limitation. Another input to comparator 442 may optionally be a threshold value 443, or a threshold value 443 may be set or registered for comparison. Thus, a magnitude of a running average may be used to determine whether to assert a flag signal, as described below in additional detail.

At 504, a running average may be compared with a threshold value. Such running average may be continuously compared against a threshold therefor to detect presence of a colored data pattern or patterns during operation of a receiver linked to one or more communications channels. In this example, optionally at 511, a magnitude of a running average x is generated for comparison at 504 with a threshold value by comparator 442. At 505, if a running average, or more particularly a running average magnitude |x| as in this example, is greater than a threshold value 443, then a pattern detected block 445 may set a flag signal 446, such as to a logic 1 state for example, to indicate such outcome. Again, because divergence may be in either a positive or negative direction in some implementations, a running average may be greater than a threshold if it is more positive or more negative than such threshold.

At 506, asserted flag signal 446 may be provided to at least one communication channel adaptation loop block for temporarily suspending operation thereof responsive to assertion of such flag signal 446. Along those lines, control logic 449 may be coupled to receive flag signal 446. Control logic 449 may be configured to count N cycles after receipt of an asserted flag signal 446 before resetting pattern detected block 445 to deassert or reset flag signal 446, such as to a logic 0 state for example, in response to assertion of reset signal 448 provided from control logic 449 to pattern detected block 445. It should be understood that for multiple types of fixed patterns, there may be symbol lengths therefor. Moreover, fixed pattern may be repeatedly provided for a number of cycles, before transmission of such fixed pattern is ceased. Along those lines, divergence from a mean of zero to exceed a threshold value, as previously described, may or may not occur after only a first instance of reception of a fixed pattern, but rather may occur at a subsequent cycle of reception of a continuous sequence or repetition of transmission of such fixed pattern. In order to cover a number of fixed patterns of different lengths both as to number of symbols and number of cycles transmitted in succession, once a colored data pattern is detected, presence of such colored data pattern may be assumed to persist for at least N cycles. Accordingly, for example a clock signal (not shown for clarity) may be provided to a counter 489 of control logic for counting to at least N cycles before effectively deasserting flag signal 446 to one or more channel adaptive loop blocks.

At least one adaptive loop block may be coupled to receive flag signal 446. Examples of adaptive loop blocks may include one or more of a decision feedback equalization block or decision feedback equalizer ("DFE") 451, an automatic gain control block or automatic gain controller ("AGO") 452, a continuous time linear equalization block or continuous time linear equalizer ("CTLE") 453, an h0 or peak voltage detection block of Vpeak detector 454, a threshold unrolling (completely or partially) loop block or unrolled threshold loop ("UT") 455, and/or a link rate channel adaptation loop block or channel adapter 456. One or more of these or other blocks, which are subject to divergence from a mean value of a slicer output as described herein, may be used.

Optionally, comparator 442 or pattern detected block 445 may be configured to assert or deassert flag signal 446. Along those lines, comparator 442 may provide an exceeded threshold signal 444 when a running average magnitude is greater than threshold value 443 and may provide a not exceeded threshold signal 447 when a running average magnitude is not greater than threshold value 443. Such signals 444 and 447 may be the same signal, only complements of one and other. Furthermore, such signals 444 and 447 may be flag signal 446. However, assuming pattern detect block 445 is not omitted, not exceeded threshold signal 447 may optionally be provided to pattern detect block 445 instead of reset signal 448 to reset flag signal 446 from an asserted state to a not asserted state. Along those lines control logic 449, as well as counter 489, may be omitted. In this configuration, rather than waiting a number of cycles N in which to unfreeze one or more adaptation loop blocks, such one or more adaptation loop blocks may be unfrozen right after a colored data pattern is no longer detected.

At 507, once a number of cycles N has been counted in order to deassert flag signal 446 or once bias detector 450 determines a colored data pattern no longer persists, flag signal 446 may be deasserted. In other words, flag signal 446 may be deasserted, whether after a sufficient amount of cycles or once detected, after a running average is no longer greater than a threshold value therefor. At 508, such one or more adaptive loop blocks temporarily suspended at 506 may resume operation, namely be unfrozen, responsive to deassertion of flag signal 446.

Accordingly, it should be understood that a bias detector 450 may be coupled to a slicer 410 or 420. Such slicer coupled to such bias detector 450 may provide an error signal 411 or 421 from such slicer to such bias detector. Bias detector is configured to determine a difference between an error input and an error mean for such error signal to detect presence of correlated data. While this difference may be determined by directly comparing a magnitude to a threshold, such difference may be determined with a subtraction operation, namely where bias detector 450 is configured to determine an error input minus an error mean of an error signal to detect presence of correlated data, and then such difference may be compared to a threshold value. Furthermore, bias detector 450 is likewise configured to detect absence of correlated data in input signaling 200, as a reverse of the relation of detection of the presence of correlated data in input signaling 200.

Figure 6:
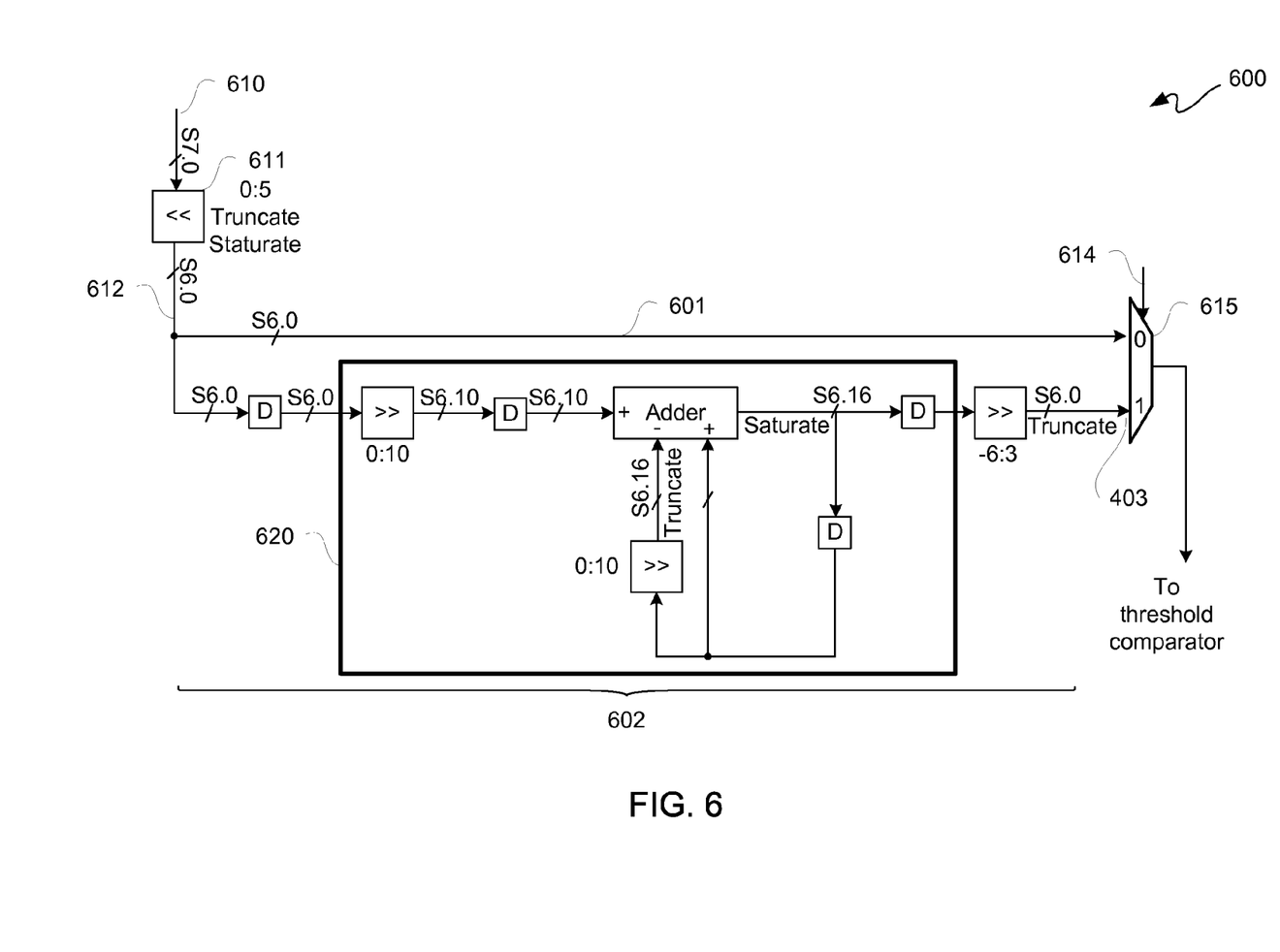
FIG. 6 is a block/circuit diagram depicting an exemplary infinite impulse response ("IIR") filter.

FIG. 6 is a block/circuit diagram depicting an exemplary IIR filter 600. In this example, IIR filter 600 includes a bypass path 601 and a leaky integrator path 602. In this example, a sign bit ("S") as part of an 8-bit data input is provided as an input 610 to a left bit shifter ("<<") 611 to saturate and to truncate such input 610 to provide an output 612. The example bit widths or other bit widths may be used to provide an IIR filter 600. Furthermore, this or another IIR filter circuit may be used. Output 612 is provided via bypass path 601 as an input to multiplexer 615 and as an input to leaky integrator path 602. A leaky integrator 620 of leaky integrator path 602 may include delay elements ("D"), a three input adder, and right bit shifters (">>"), as well as other circuitry. As leaky integrators are known, description of leaky integrator path 602 is not provided for purposes of clarity. An IIR filter 439 of FIG. 4 may include a leaky integrator for providing a running average signal 403. Output of leaky integrator path 602 may be a running average signal, such as running average signal 403 for example. Running average signal 403 may be provided as an input to multiplexer 615, which is used to select responsive to control signal 614 provided thereto which input to output to a threshold comparator, such as comparator module 440 of FIG. 4 for example.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
a bias detector; and
a slicer coupled to the bias detector to provide an error signal from the slicer to the bias detector;
wherein the bias detector is configured to determine a difference between an error input and an error mean for the error signal to detect a presence of correlated data in input signaling.

2. The apparatus according to claim 1, wherein the bias detector is configured to determine the difference between the error input and the error mean for the error signal to detect an absence of correlated data in the input signaling.

3. The apparatus according to claim 1, wherein the slicer is an error slicer.

4. The apparatus according to claim 1, wherein the slicer is a crossing slicer.

5. The apparatus according to claim 1, wherein the bias detector includes a comparator to compare the difference as a magnitude compared to a threshold value.

6. The apparatus according to claim 1, wherein the bias detector includes a running average block to determine the error mean of the error signal.

7. The apparatus according to claim 6, wherein the running average block includes an infinite impulse response ("IIR") filter to determine the error mean of the error signal.

8. An apparatus, comprising:
a slicer;
a running average block coupled to receive an error output from the slicer to provide an average therefor;
a comparator coupled to the running average block to receive the average from the running average block to compare the average with a threshold value;
wherein the comparator is coupled to assert a flag signal responsive to the average being greater than the threshold value; and
at least one adaptive loop block coupled to receive the flag signal;
wherein the at least one adaptive loop block is coupled to temporarily suspend operation thereof responsive to assertion of the flag signal.

9. The apparatus according to claim 8, wherein the average block includes an infinite impulse response filter.

10. The apparatus according to claim 8, wherein the average block includes a finite impulse response filter.

11. The apparatus according to claim 8, wherein:
the comparator includes a magnitude block coupled to receive the average and to provide a magnitude therefore; and
the comparator is configured to compare the magnitude with the threshold value to determine whether to assert the flag signal.

12. The apparatus according to claim 8, wherein the at least one adaptive loop block is coupled to resume operation thereof responsive to deassertion of the flag signal.

13. The apparatus according to claim 8, wherein the at least one adaptive loop block is for at least one of: decision feedback equalization, automatic gain control, continuous time linear equalization, peak voltage detection, threshold unrolling, or link rate adaptation.

14. The apparatus according to claim 9, wherein the infinite impulse response filter includes a leaky integrator.

15. A method, comprising:
receiving information by a slicer;
determining a running average for an error output from the slicer;
comparing the running average with a threshold value;

asserting a flag signal in response to the running average being greater than the threshold value; and temporarily suspending operation of at least one adaptive loop block in response to assertion of the flag signal.

16. The method according to claim 15, further comprising:
selecting a mode of operation as between a first mode and a second mode;
wherein the error output is from an error slicer for the slicer in the first mode and a crossing slicer for the slicer in the second mode.

17. The method according to claim 15, further comprising:
deasserting the flag signal responsive to the running average not being greater than the threshold value; and
resuming operation of the at least one adaptive loop block responsive to deassertion of the flag signal.

18. The method according to claim 15, further comprising generating a magnitude of the running average for the comparing with the threshold value to determine whether to assert the flag signal.

19. The method according to claim 15, wherein the running average is determined by an infinite impulse response filter.

20. The method according to claim 15, wherein the infinite impulse response filter includes a leaky integrator.

* * * * *